(12) United States Patent
Garbin et al.

(10) Patent No.: US 11,443,174 B2
(45) Date of Patent: Sep. 13, 2022

(54) MACHINE LEARNING ACCELERATOR

(71) Applicants: IMEC VZW, Leuven (BE); Katholieke Universiteit Leuven, KU LEUVEN R&D, Leuven (BE)

(72) Inventors: Daniele Garbin, Leuven (BE); Simone Lavizzari, Paris (FR)

(73) Assignees: IMEC VZW, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 560 days.

(21) Appl. No.: 16/682,466

(22) Filed: Nov. 13, 2019

(65) Prior Publication Data

US 2020/0151550 A1 May 14, 2020

(30) Foreign Application Priority Data

Nov. 13, 2018 (EP) ..................................... 18205919

(51) Int. Cl.
*G06N 3/063* (2006.01)
*G11C 13/00* (2006.01)
*G11C 16/26* (2006.01)

(52) U.S. Cl.
CPC ........... *G06N 3/063* (2013.01); *G11C 13/004* (2013.01); *G11C 13/0026* (2013.01);
(Continued)

(58) Field of Classification Search
CPC ... G06N 3/063; G11C 13/0026; G11C 13/004
(Continued)

(56) References Cited

U.S. PATENT DOCUMENTS 5,537,512 A 7/1996 Hsia et al.
6,032,140 A 2/2000 Fabbrizio et al.
(Continued)

FOREIGN PATENT DOCUMENTS

EP 1698054 B1 9/2007
EP 2544239 A1 1/2013

OTHER PUBLICATIONS

European Search Report, European Patent Application No. 18205919.6, dated May 6, 2019, 9 pages.
(Continued)

*Primary Examiner* — Vu A Le
(74) *Attorney, Agent, or Firm* — McDonnell Boehnen Hulbert & Berghoff LLP

(57) ABSTRACT

A neural network circuit for providing a threshold weighted sum of input signals comprises at least two arrays of transistors with programmable threshold voltage, each transistor storing a synaptic weight as a threshold voltage and having a control electrode for receiving an activation input signal. Additionally, for each array of transistors, a reference network associated therewith, which provides a reference signal to be combined with the positive or negative weight current components of the transistors of the associated array, the reference signal having opposite sign compared to the weight current components of the associated array, thereby providing the threshold of the weighted sums of the currents. Further, at least one bitline is configured to receive the combined positive and/or negative current components, each combined with their associated reference signals.

12 Claims, 12 Drawing Sheets

(52) U.S. Cl.
CPC .......... *G11C 13/0069* (2013.01); *G11C 16/26* (2013.01); *G11C 2213/71* (2013.01)

(58) Field of Classification Search
USPC .................................................. 365/185.01
See application file for complete search history.

(56) References Cited

U.S. PATENT DOCUMENTS

2016/0048755 A1* 2/2016 Freyman ................. G06N 3/06
  365/185.05
2018/0349762 A1* 12/2018 Lee ..................... H01L 27/1159

OTHER PUBLICATIONS

Fick, L. et al., "Analog In-Memory Subthreshold Deep Neural Network Accelerator", 2017 IEEE Custom Integrated Circuits Conference (CICC). IEEE, 2017, 4 pages.

* cited by examiner

MACHINE LEARNING ACCELERATOR

CROSS-REFERENCE TO RELATED APPLICATIONS

The present application is a non-provisional patent application claiming priority to European Patent Application No. 18205919.6, filed Nov. 13, 2018, the contents of which are hereby incorporated by reference.

FIELD OF THE DISCLOSURE

The present disclosure relates to the field of neural networks. More particularly, the present disclosure relates to neuromorphic architectures that perform weighted sum computations as a basic calculation performed in neural networks and machine learning algorithms.

BACKGROUND

Deep Neural Networks (DNNs) are a class of machine learning (deep learning) algorithms that have gained interest in recent years, thanks to their state-of-the-art accuracy in complex problems such as image and speech recognition tasks. A typical DNN comprises multiple layers of neurons interconnected by synapses. During inference (classification) mode, input data (image, sound track, etc.) are transformed by a series of Multiply Accumulate (MAC) operations, i.e. sums weighted by the synapses values, and non-linearity functions performed by the neurons. At the output layer, the active neuron will indicate the class of the input (classification). In DNNs, data flows from the input layer to the output layer without looping back; they are feedforward networks.

The performance of DNNs mapped on conventional Von Neumann computing architectures is affected by the so-called memory bottleneck: a lot of energy (and time) is wasted due to the movement of a large quantity of information (synaptic weights) from the memory unit to the processing unit and vice versa. This moving of date consumes more energy and time than the actual computation itself.

With the increasing market for smart devices, Internet of Things (IoT), and mobile devices, energy efficiency is of primary importance to increase battery life. For this reason, many industries and research groups have invested resources to develop dedicated non-Von Neumann hardware, aimed at improving the energy efficiency of DNNs. From an algorithmic point of view, efforts are being made to reduce the complexity of the algorithm by reducing the precision of the operands, in order to improve efficiency and reduce the data transfer (from floating point precision to integer precision 16 bits, 8 bits or even 1 bit).

SUMMARY

Embodiments of the present disclosure provide a hardware implementation of a neural network, which is dense and energy efficient.

In embodiments, the present disclosure provides a neural network circuit for providing a threshold weighted sum of input signals. The neural network circuit comprises: at least two arrays of transistors with programmable threshold voltage, each transistor storing a synaptic weight as a threshold voltage and having a control electrode for receiving an activation input signal, each transistor of the at least two arrays providing an output current for either a positive weighted current component in an array of a set of first arrays or a negative weighted current component in an array of a set of second arrays; for each array of transistors, a reference network associated therewith, for providing a reference signal to be combined with the positive or negative weight current components of the transistors of the associated array, the reference signal having opposite sign compared to the weight current components of the associated array, thereby providing the threshold of the weighted sums of the currents; and at least one bitline for receiving the combined positive and/or negative current components, each combined with their associated reference signals.

In a neural network circuit according to embodiments of the present disclosure, the transistors of the at least two arrays connect to a single bitline for receiving the positive and negative current components combined with reference signals. A comparator may compare the combined positive and negative current components combined with reference signals to a pre-determined reference value.

In a neural network circuit according to alternative embodiments of the present disclosure, the transistors of one of the arrays connect to a first bitline different from a second bitline to which the transistors of the other one of the arrays connect, the bitlines respectively being for each receiving the combined positive current component and associated reference signal, or the combined negative current component and associated reference signal. The neural network circuit may then furthermore comprise a differential amplifier for amplifying the difference between the combined positive current components and negative reference signal with the combined negative current components and positive reference signal.

In a neural network circuit according to embodiments of the present disclosure, transistors of an array may be laid out in a single physical plane of an electronic component. A plurality of such planes of transistors may be stacked vertically.

In a neural network circuit according to embodiments of the present disclosure, the weighted current components may be provided by driving multiple transistors in parallel.

In embodiments of the present disclosure, the transistors generating a positive or negative weighted current component may be laid out on a same horizontal plane of a three-dimensional array.

In a neural network circuit according to embodiments of the present disclosure, the transistors may be operated in subthreshold region and act as current sources controlled by an input gate voltage.

In a neural network circuit according to embodiments of the present disclosure, the reference network may be implemented as one or more transistors in parallel. The transistors may be activated by turning them on or off. In a neural network circuit according to alternative embodiments of the present disclosure, the reference network may be implemented as one or more programmable resistive memories in parallel.

Particular aspects of the disclosure are set out in the accompanying independent and dependent claims. Features from the dependent claims may be combined with features of the independent claims and with features of other dependent claims and not merely as explicitly set out in the claims.

For purposes of describing the disclosure, certain examples of the disclosure have been described herein above. It is to be understood that not all such examples may be achieved in accordance with any particular embodiment of the disclosure. Thus, for example, those skilled in the art will recognize that the disclosure may be embodied or carried out in a manner that achieves one aspect as taught herein without necessarily achieving other aspects as may be taught or suggested herein.

The above and other aspects of the disclosure will be apparent from and elucidated with reference to the embodiment(s) described hereinafter.

BRIEF DESCRIPTION OF THE FIGURES

The above, as well as additional, features will be better understood through the following illustrative and non-limiting detailed description of example embodiments, with reference to the appended drawings.

Figure 1:
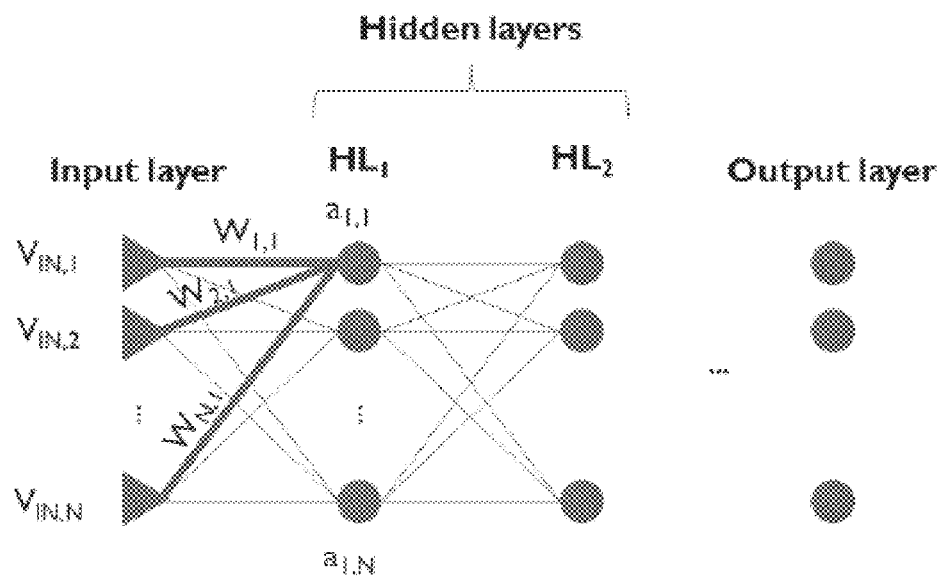
FIG. 1 is a schematic representation of a fully connected neural network, with fully parallel computation in one layer, and sequential computation layer after layer, as known in the art.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under certain circumstances and that the embodiments of the disclosure described herein are capable of operation in other sequences than described or illustrated herein.

Moreover, directional terminology such as top, bottom, front, back, leading, trailing, under, over and the like in the description and the claims is used for descriptive purposes with reference to the orientation of the drawings being described, and not necessarily for describing relative positions. Because components of embodiments of the present disclosure can be positioned in a number of different orientations, the directional terminology is used for purposes of illustration only, and is in no way intended to be limiting, unless otherwise indicated. It is, hence, to be understood that the terms so used are interchangeable under certain circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being redefined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Neuromorphic systems, also referred to as artificial neural networks, are computational systems so configured that electronic systems wherein they are provided, can essentially function in a manner that more or less imitates the behavior of networks of biological neurons. Still, in some cases the link to the biological neurons is mostly lost, like in the case of so-called convolutional neural networks (CNNs) or deep-learning neural networks (DNNs). Neuromorphic computation does not generally utilize the traditional digital model of manipulating zeros and ones. In order to allow communication between potentially strongly connected neurons in such neural networks, connections are created between processing elements which are roughly functionally equivalent to neurons of a biological brain. Neuromorphic computation may comprise various electronic circuits that are modelled on biological neurons and synapses.

Typically multi-layer neural networks are used, with one or more hidden layers (or in general intermediate layers if non-standard neural network topologies would be used). Some well-known examples include perceptrons (including multilayer perceptrons or MLPs), convolutional neural networks (CNNs), asynchronous conceptors, restricted Boltzmann machines (RBMs), liquid state machines (LSM), long-short term memory networks (LSTM), and deep-learning neural networks (DNNs).

A schematic representation of a feedforward multi-layer artificial neural network is given in FIG. 1. The network comprises at least three layers of nodes, also called neurons or activations. In the embodiment illustrated four layers of nodes are provided: an input layer, an output layer and two intermediate hidden layers $H_{L1}$, $H_{L2}$. In a fully connected network, each node of one layer is connected by synapses, also called weights or synaptic weights, to every node in the following layer.

Except for the input nodes $V_{IN,i}$, each node is a neuron (or activation) that receives the weighted sum of its inputs and applies a non-linearity function a=f(x).

$$\begin{cases} a_{1,1} = f_1\left(\sum_{i=1}^{N} V_{IN,i} \cdot W_{i,1}\right) \\ \vdots \\ a_{1,N} = f_N\left(\sum_{i=1}^{N} V_{IN,i} \cdot W_{i,N}\right) \end{cases}$$

The node then sends its results to the next layer, and again, the receiving node at the next layer determines a weighted sum of its inputs and applies a non-linearity function. This way, a fully parallel computation is performed in one layer, and a sequential computation is performed layer after layer.

The weighted sum is a multiply accumulate (MAC) operation. In this calculation, a set of inputs $V_{IN,i}$ are multiplied by a set of weights $W_{i,j}$, and those values are summed to create a final result. This is a basic computation step for most neural networks. Further, $f_i(x)$ is the non-linearity function. The non-linearity function may be a threshold function, for instance a hard sigmoid function, defined as $$f_i(x) = \begin{cases} 0, & x < Ref_i \\ 1, & x \geq Ref_i \end{cases}$$

$Ref_i$ are local reference values, than can be unique to each neuron.

In the context of the present disclosure, the activations are assumed to be binary (0/1). The weights are multilevel, and can be positive or negative: (Wmin, ..., Wmax)=(−1, ..., 1).

When focusing on one neuron $a_{1,1}$ only:

$$a_{1,1} = f_1(x) = \begin{cases} 0, & x < Ref_1 \\ 1, & x \geq Ref_1 \end{cases} \quad \text{(Eq. 1)}$$

$$a_{1,1} = f_1(x) = \begin{cases} 0, & \sum_{i=1}^{N} V_{IN,i} \cdot W_{i,1} < Ref_1 \\ 1, & \sum_{i=1}^{N} V_{IN,i} \cdot W_{i,1} \geq Ref_1 \end{cases}$$

The weights and the references can each be written as the sum of a positive part and a negative part:

$W=|W_{POS}|-|W_{NEG}|$ $Ref=|Ref_{POS}|-|Ref_{NEG}|$

Based on this, Eq.1 can be rewritten as $$a_{1,1} = f_1(x) = \begin{cases} 0, & \sum_{i=1}^{N} V_{IN,i} \cdot W_{POSi,1} - \sum_{i=1}^{N} V_{IN,i} \cdot W_{NEGi,1} - Ref_{POS1} + Ref_{NEG1} < 0 \\ 1, & \sum_{i=1}^{N} V_{IN,i} \cdot W_{POSi,1} - \sum_{i=1}^{N} V_{IN,i} \cdot W_{NEGi,1} - Ref_{POS1} + Ref_{NEG1} \geq 0 \end{cases} \quad \text{(Eq. 2)}$$

The present disclosure proposes a DNN architecture (inference engine) where synaptic weights (both positive $W_{POSi,j}$ and negative $W_{NEG\ i,j}$ values) and neuron functionalities are integrated in a 3D stacked memory array. The disclosure enables the mapping of a full DNN in a stand-alone chip, mapping different layers of the neural network to the different horizontal planes of the 3D array. Energy efficiency is ensured by the operation of the transistors in the subthreshold regime (which is associated to low current and hence to low power), and the present disclosure avoids the uses of expensive DAC's or operational amplifiers (e.g., op-amps), as the non-linearity function is performed in place.

To obtain this, each MAC operation together with the non-linearity operation, as reflected in Eq.2, is, in accordance with embodiments of the present disclosure, implemented as the comparison of two competing current components. A first one of the competing current components corresponds to the positive weight contribution of the weighted sum, plus the negative contribution of the neuron reference. A second one of the competing current components corresponds to the negative weight contribution of the weighted sum, plus the positive neuron reference.

In accordance with embodiments of the present disclosure, the current components are generated by driving transistors. The transistors provide a current component corresponding to the positive weight contribution of the weighted sum, and a current component corresponding to the negative weight contribution of the weighted sum, and optionally also a current component corresponding to the positive contribution of the neuron reference and/or a current component corresponding to the negative contribution of the neuron reference, respectively.

Figure 2:
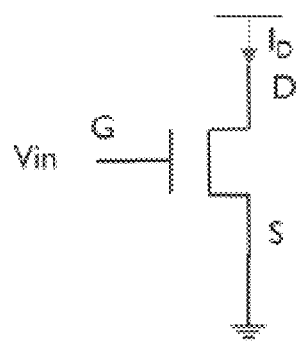
FIG. 2 is a known representation of a transistor.

The transistors have a programmable threshold voltage $V_T$. The transistors may, for example, be of any of the following types: silicon-oxide-nitride-oxide-silicon (SONOS), metal-oxide-nitride-oxide-silicon (MONOS), floating gate. A standard representation of a transistor is shown in FIG. 2. The transistor is a three-terminal device with a control electrode (gate (G)) and two main electrodes (source (S) and drain (D)). Upon application of a sufficiently large voltage $V_{in}$ to the control electrode, a device current ID flows through the transistor.

In accordance with embodiments of the present disclosure, the transistors are operated in the subthreshold region (gate voltage smaller than but close to the threshold voltage, $V_{GS} \leq V_T$).

$$I_{D(sub-threshold)} \approx \frac{W}{L}\alpha_e C_{ox}^* \left(\frac{kT}{q}\right)^2 (n-1)e^{q[V_{GS}-V_T]/nkT}(1-e^{-qV_{DS}/kT})$$

With the first part of this equation being a constant current $I_s$, with the negative overdrive voltage $V_{OV} = V_{GS} - V_T$, and with $(1-e^{-qV_{DS}/kT}) \sim 1$ for large enough $V_{DS}$, this equation becomes $$I_D \approx I_S \exp(V_{OV}/V_T)$$

Hence, $$\begin{cases} I_D \propto W_{POS(NEG)} & \text{if } V_{in} = V_{high} \\ I_D \sim 0 & \text{if } V_{in} = 0 \text{ V} \end{cases}$$

Each transistor acts as a current source controlled by the input gate voltage $V_{in}$. The threshold voltage values are programmed according to the synaptic weight value, hence the current is proportional to the weight stored as the threshold voltage.

Figure 3:
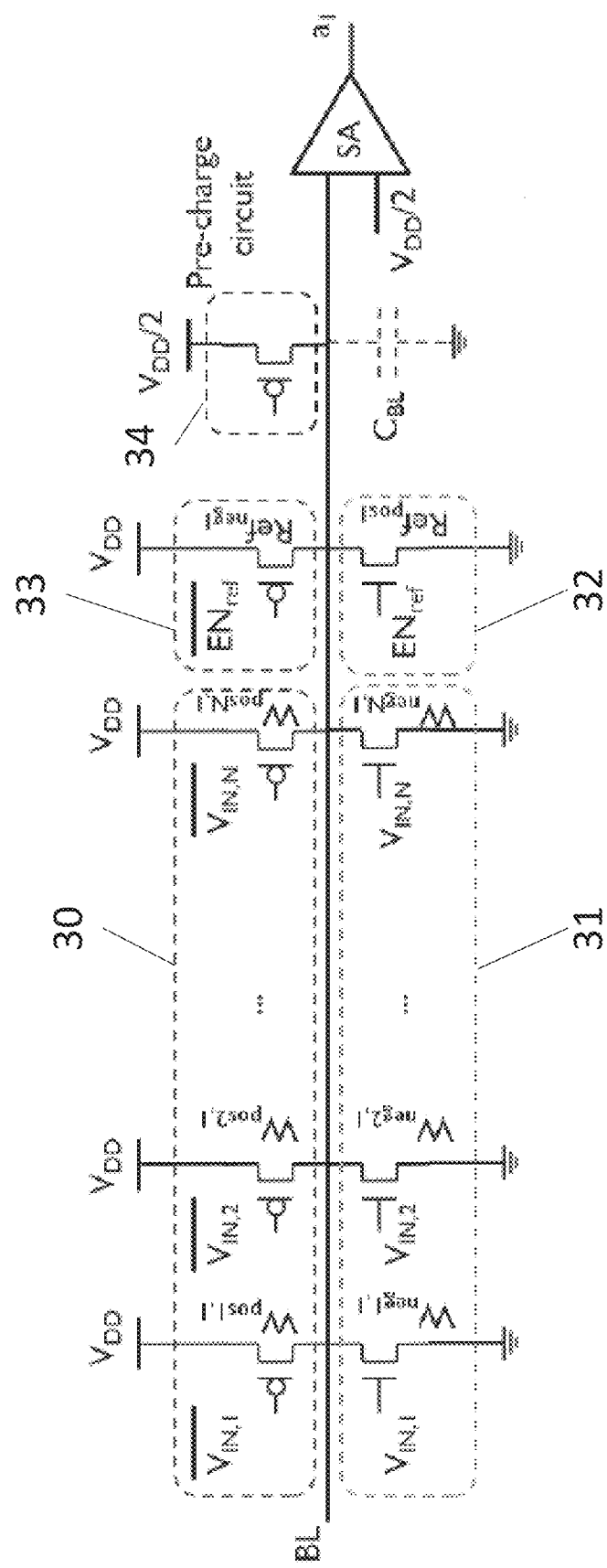
FIG. 3 illustrates a first embodiment of the present disclosure, with p-channel and n-channel MOSFETs, respectively providing n positive and a negative weight current component to a same bitline.

As illustrated in FIG. 3, in a first embodiment, the current component corresponding to the positive weight contribution of the weighted sum may be obtained by driving multiple transistors in parallel. These transistors may be p-channel MOSFETS coupled between a bitline (BL) and a positive power supply ($V_{DD}$), forming a pull-up weight network 30. The transistors act as a current source driven in voltage. For their contribution to the value of node $a_{1,1}$, the transistors providing the current component corresponding to the positive weight contribution of the weighted sum each have the inverse of $V_{IN,i}$ at their gate, and each store a weight $W_{POS\,i,1}$.

Similarly, the current component corresponding to the negative weight contribution of the weighted sum may also be obtained by driving multiple transistors in parallel. These transistors may be n-channel MOSFETS coupled between the bitline (BL) and ground, forming a pull-down weight network 31. The transistors act as a current source driven in voltage. For their contribution to the value of node $a_{1,1}$, the transistors providing the current component corresponding to the negative weight contribution of the weighted sum each have $V_{IN,i}$ at their gate, and each store a weight $W_{NEG\,i,1}$.

The current component corresponding to the positive contribution of the neuron reference may be obtained by driving one or more transistors, whereby in the latter case the transistors are coupled in parallel. Here again the transistor(s) is or are n-channel MOSFETs coupled between the bitline (BL) and ground, forming a pull-down reference network 32. Also the current component corresponding to the negative contribution of the neuron reference may be obtained by driving one or more transistors, whereby in the latter case the transistors are coupled in parallel. The transistor(s) is or are p-channel MOSFETs coupled between the bitline (BL) and the positive supply voltage (VDD), forming a pull-up reference network 33.

For including p-channel MOSFETs on top of the bitline BL, between the positive power supply (VDD) and the bitline (BL), and n-channel MOSFETs below the bitline, between the bitline (BL) and ground (GND), having the bitline substantially in the middle of the thus formed vertical stack, the typically used 3D NAND process flow may be used and modified. Possible modifications include but are not limited to: changing the material composing the vertical channel of the transistors, doping the channel, changing the diameter of the memory hole (the vertical cylinder), changing the material of the word lines, and/or changing the doping of the word lines. Such change(s) come(s) at a cost.

In use, the bitline (BL), or in practice its bitline (parasitic) node capacitance, is pre-charged at a predetermined value, e.g. $V_{DD}/2$. Hereto, a pre-charge circuit 34 may be provided. The pre-charge circuit 34 may be formed by a transistor coupled between the bitline (BL) and a voltage supply which equals the predetermined value, e.g. but not limited thereto VDD/2. After precharging the bitline (BL), it is discharged to ground or charged to the positive power supply ($V_{DD}$), depending on the relative strength of the pull-down and pull-up weight networks 30, 31 and reference networks 32, 33, or thus depending on the accumulated current flowing through the transistors in the pull-up and pull-down weight networks 30, 31 and reference networks 32, 33.

The thus obtained voltage signal at the bitline node is compared with the predetermined reference value, e.g. $V_{DD}/2$, common to all neurons. This comparison may be performed by a sense amplifier (SA), which thus can sense a variation in the bitline voltage. The output of the sense amplifier (SA) is the neuron activation value $a_{i,j}$, $a_{1,1}$.

In some embodiments, the transistors may be implemented as vertical transistors, which allows for dense compact structures.

The transistors in the pull-up and pull-down weight networks 30, 31, respectively, may lay in a same horizontal plane, one plane for each type of competing current component contribution (one plane for n-channel MOSFETs, one plane for p-channel MOSFETs) of a three-dimensional array.

Figure 4:
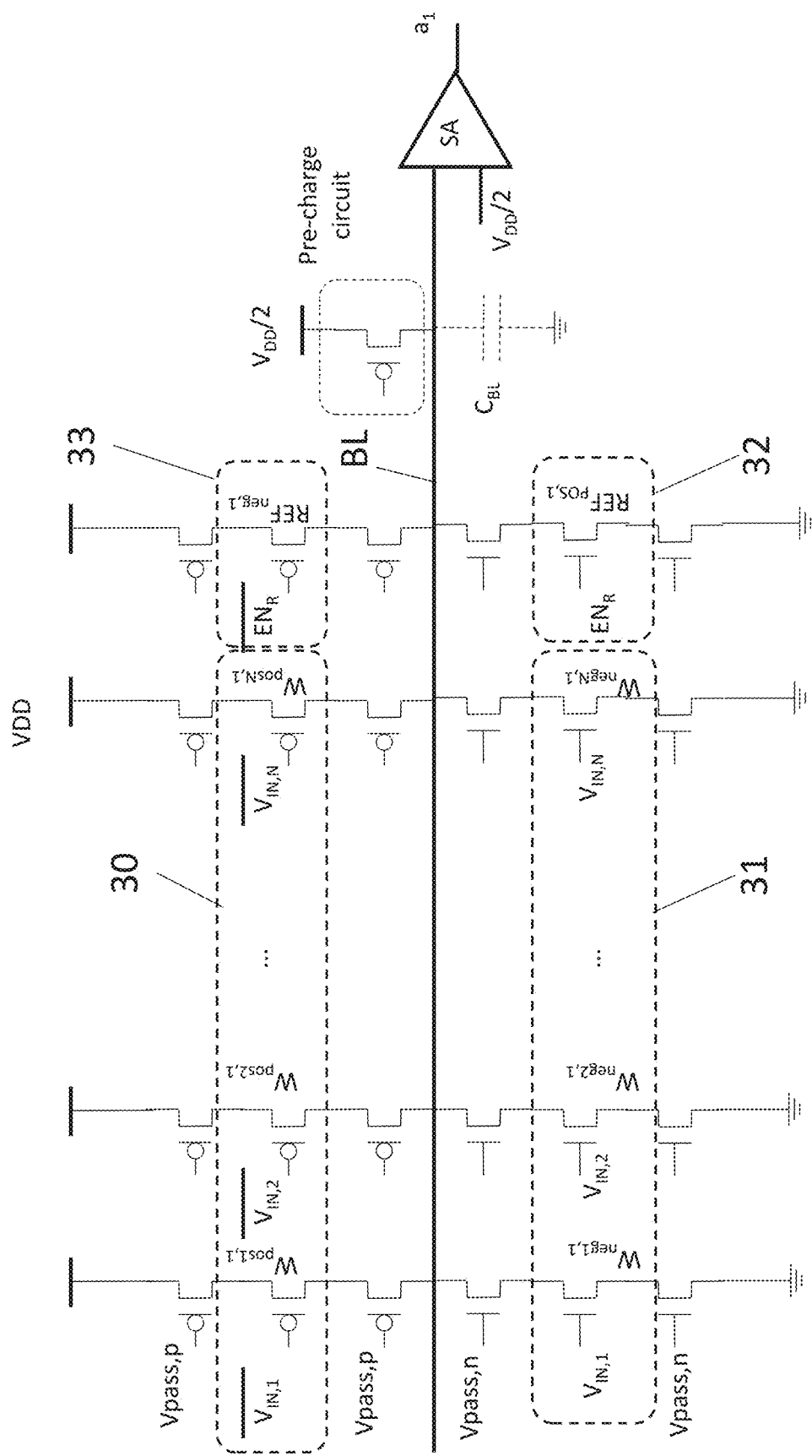
FIG. 4 illustrates a second embodiment of the present disclosure, with p-channel and n-channel metal-oxide semiconductor field-effect transistors (MOSFETs), respectively providing n positive and a negative weight current component to a same bitline, but wherein the MOSFETS are laid out in a plurality of planes which are sequentially addressable for activation.

A particular embodiment is a 3D-NAND configuration, as illustrated in FIG. 4. In this embodiment, a plurality of planes on top of one another are provided in a pull-up or pull-down network. In the example illustrated, four planes are provided in a pull-up or pull-down network, but this is not intended to be limiting: the number of planes can for instance vary from 2 to 96. Such structure of at least two planes, e.g. four planes, in general for instance between 2 and 96 planes, is laid out above and below a bitline plane. Two horizontal planes per neural network layer (a pull-up plane and a pull-down plane) are actively used at every calculation step for determining the next node value. Other horizontal planes are bypassed when not computing that layer. The bypassing is done by driving the gate voltage of the transistors of these other planes to $V_{pass} \gg V_T$. For instance, without being limited thereto, $V_{pass}$ can be set to the power supply voltage ($V_{DD}$) for n-channel MOSFETS, and $V_{pass}$ can be set to 0 V for p-channel MOSFETs. This way, the thus driven transistors act as short-circuits. Example embodiments provide a very high density, mainly by the high 3D integration.

Figure 5:
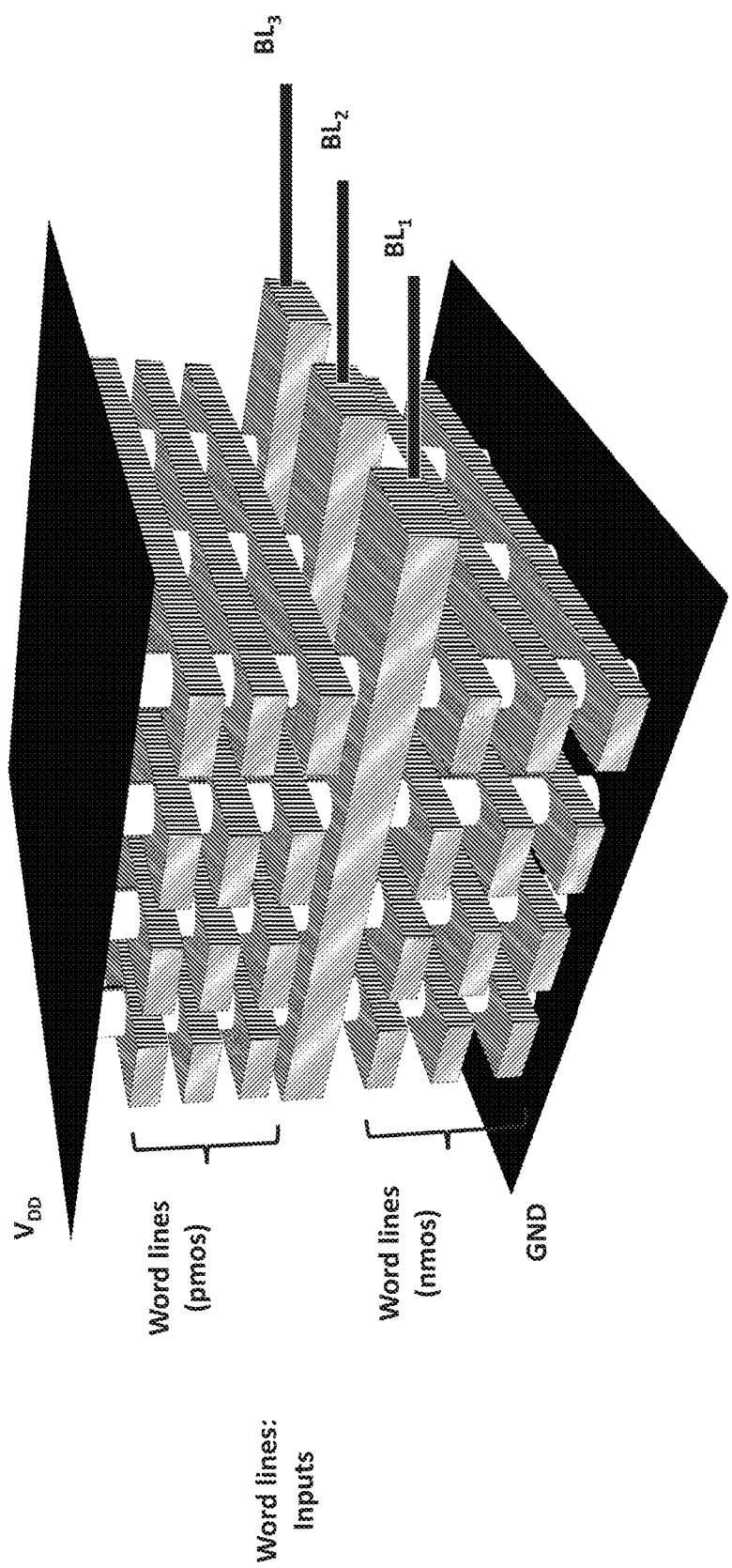
FIG. 5 is a schematic three dimensional (3D) view of the architecture schematically illustrated in FIG. 4.

FIG. 5 shows a 3D view of the 3D NAND configuration introduced in FIG. 4. A middle plane is shown, comprising a plurality of bitlines $BL_1$, $BL_2$, $BL_3$, one of which, indicated as BL, is shown in FIG. 4. The bitlines may run parallel to one another, in the middle plane. The bitlines ($BL_i$) provide the output values to a next layer in the neural network. Above and below the middle plane, planes with word lines are provided, in the embodiment illustrated in FIG. 5, three planes above the middle plane and three planes below the middle plane. The word lines in a single plane may be strips which may run parallel to one another, and, in some examples, in a direction substantially orthogonal to the direction of the bitlines ($BL_i$). The planes containing word lines are laid out substantially parallel to the middle plane containing the bitlines. The planes containing the word lines are stacked onto one another, and this way also a subset of word lines may be stacked onto one another. On the word lines, where in a top view word lines and bitlines cross, vertical transistors are provided. Vertical transistors connected to stacked word lines are stacked in a column, thus connecting the power supply plane ($V_{DD}$) or the ground plane (GND), depending on the position of the word line planes, to the bitlines. The word lines in a single plane provide the inputs $V_{in,i}$. One single word line, e.g. $V_{in,1}$, is shared with a plurality of transistors, and thus provides the same input to all those transistors in parallel. The transistors connected to the same input line $V_{in,i}$ each store a different weight $W_{i,j}$. The multiplication of the input value $V_{in,i}$ of a particular word line, e.g. $V_{in,1}$, with the weights $W_{i,j}$ of each of the transistors related to this word line, e.g. $W_{1,1}$, $W_{1,2}$, . . . , $W_{1,N}$, are each brought to a different bitline $BL_1$, $BL_2$, $BL_3$. The multiplications of the input values $V_{in,i}$ of different word lines, e.g. $V_{in,1}$, $V_{in,2}$, etc, with respective weights $W_{i,j}$ for a particular j, are all brought to the same bitline $BL_j$. The transistors storing these weights $W_{i,j}$ provide the pull-up network.

In example embodiments of the present disclosure, as shown for example in FIG. 5, multiple neurons (bitlines) can be evaluated in parallel, as inputs are common and shared along the word line direction. Different layers of DNN can be mapped on different horizontal planes of the 3D array. In example embodiments of the present disclosure a 3D NAND configuration provides the highest possible density option.

Figure 6:
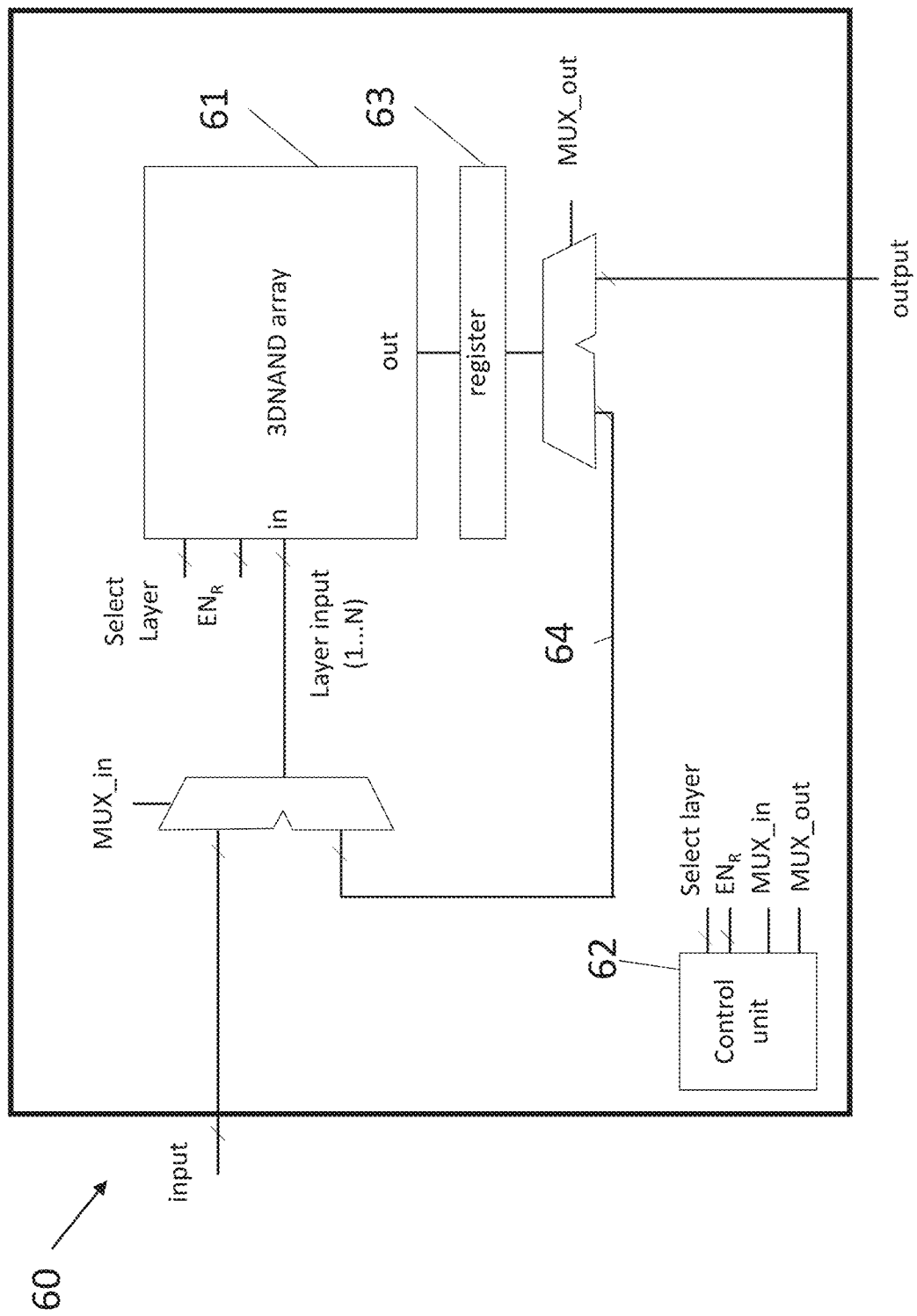
FIG. 6 is a block schematic illustration of a neuromorphic architecture according to embodiments of the present disclosure.

A block-schematic overview of a system 60 according to embodiments of the present disclosure is given in FIG. 6. The basic building block is a 3D NAND array 61 as for instance illustrated in FIG. 5. The 3D NAND array 61 comprises a double plurality of input word lines: a plurality of word lines in one plane, and a plurality of such planes are provided. The 3D NAND array 61 also has a plurality of output bitlines. A control unit 62 is provided, which determines which planes (positive and negative) of input word lines will be addressed with the $V_{in,i}$ signals provided on the plane input port. Also the reference signals for the reference pull-up and pull-down networks are provided as an input to the 3D NAND array 61. By the MAC operation, output signals are generated at the port OUT, which output signals are brought to the nodes of a next layer of the neural network.

In particular embodiments, the output signals of a particular layer may also be fed back to the input of a next layer, where these signals will act as the new input signals to be applied to this next layer. The output of the array should be stored, for example in a register 63. At the next clock cycle, the control unit 62 will provide the correct signals to the multiplexers MUX_in, MUX_out to re-route the wiring to create a feedback loop 64 that returns the output of the array 61 back to its input, to be applied to a next layer.

Figure 7:
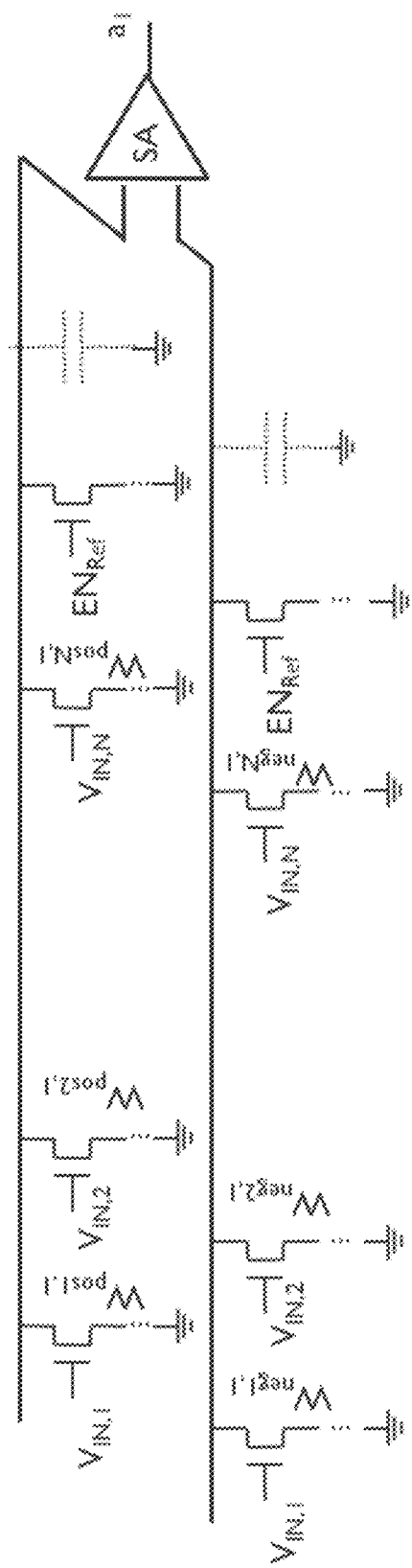
FIG. 7 illustrates a third embodiment of the present disclosure, with the planes for positive and negative weight current contributions being implemented, as an example, only with n-channel MOSFETs.

As an alternative to the 3D NAND configuration as in FIG. 3, FIG. 4 and FIG. 5, with positive and negative contributions laid out above and below a bitline plane, the positive and negative contributions can be laid out all at the same side of the bitline plane. As such, this may not provide different types of MOSFETS. The circuit can be set up with p-channel MOSFETs only, between the positive power supply and the bitline (not illustrated), or, as illustrated in FIG. 7, with n-channel MOSFETs only, between the bitline and ground. A plurality of layers of p-channel or n-channel MOSFETs can be provided in a stack, as illustrated by the points of ellipsis in FIG. 7. In embodiments of the present disclosure, only one type of transistors may be provided, which makes the fabrication of the circuit easier. The two planes for the positive and the negative contributions are then sensed differentially. This circuit is less complex than the circuit of FIG. 3 or FIG. 4, but has only half the density. Also in such embodiments different planes may be provided, with vertically stacked transistors which are bypassed when a particular plane is selected, but such bypassed transistors are not illustrated in FIG. 7.

Figure 8:
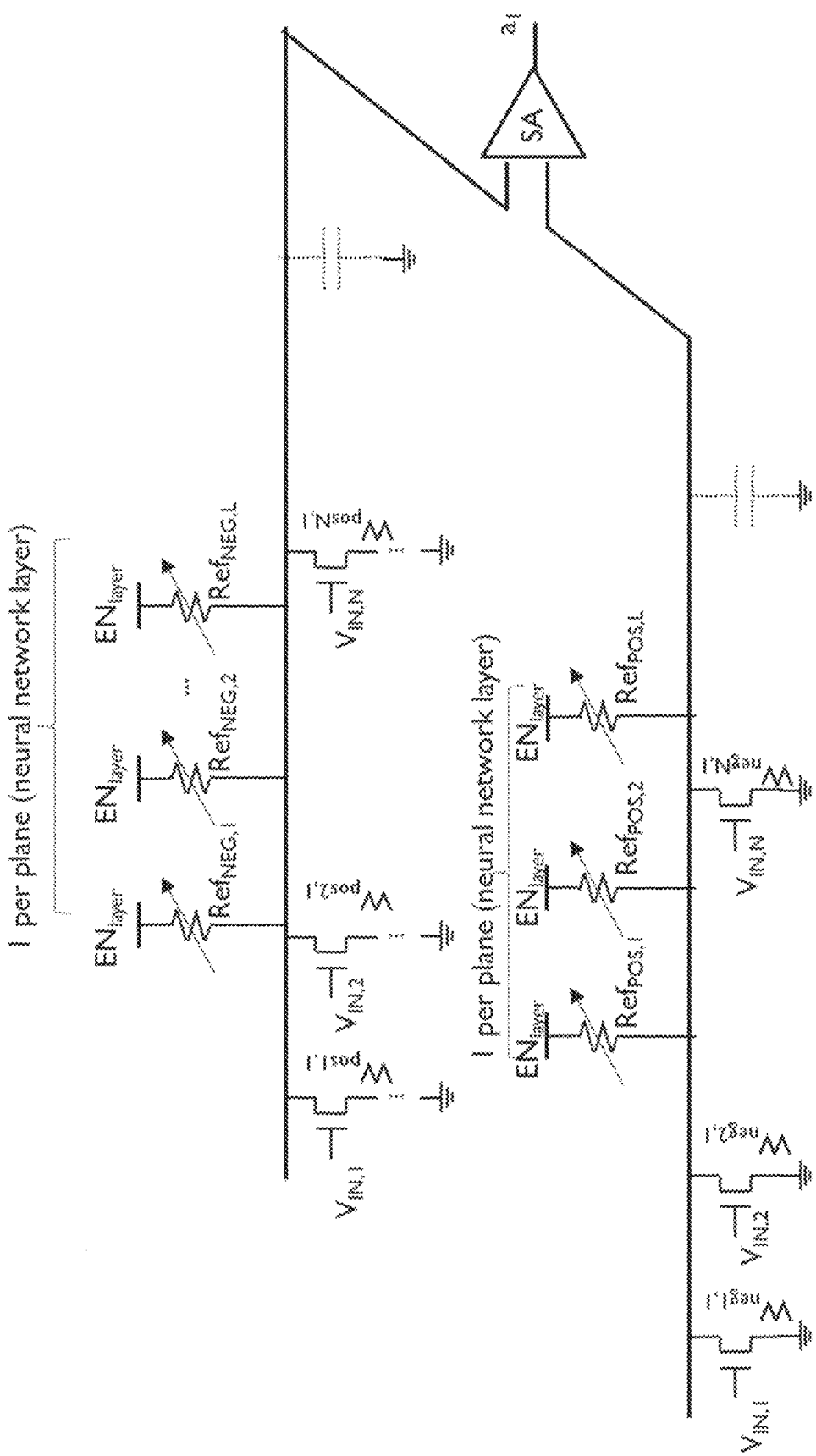
FIG. 8 and FIG. 9 illustrate a fourth and a fifth embodiment of the present disclosure, in which the reference contribution is implemented as programmable resistive memory elements, for implementations with n-channel MOSFETS only or with a combination of n-channel MOSFETs and p-channel MOSFETs.

Yet an alternative implementation is illustrated in FIG. 8. In this embodiment, the reference contribution is implemented as one or more programmable resistive memory elements rather than as transistors as in the previous embodiments. In this example embodiment, the programmable resistive memory elements can be integrated in back end of line (BEOL) processing. Similarly as in FIG. 7, in these embodiments different planes may be provided with vertically stacked transistors which are bypassed when a particular plane is selected, but such bypassed transistors are not illustrated in FIG. 8.

Figure 9:
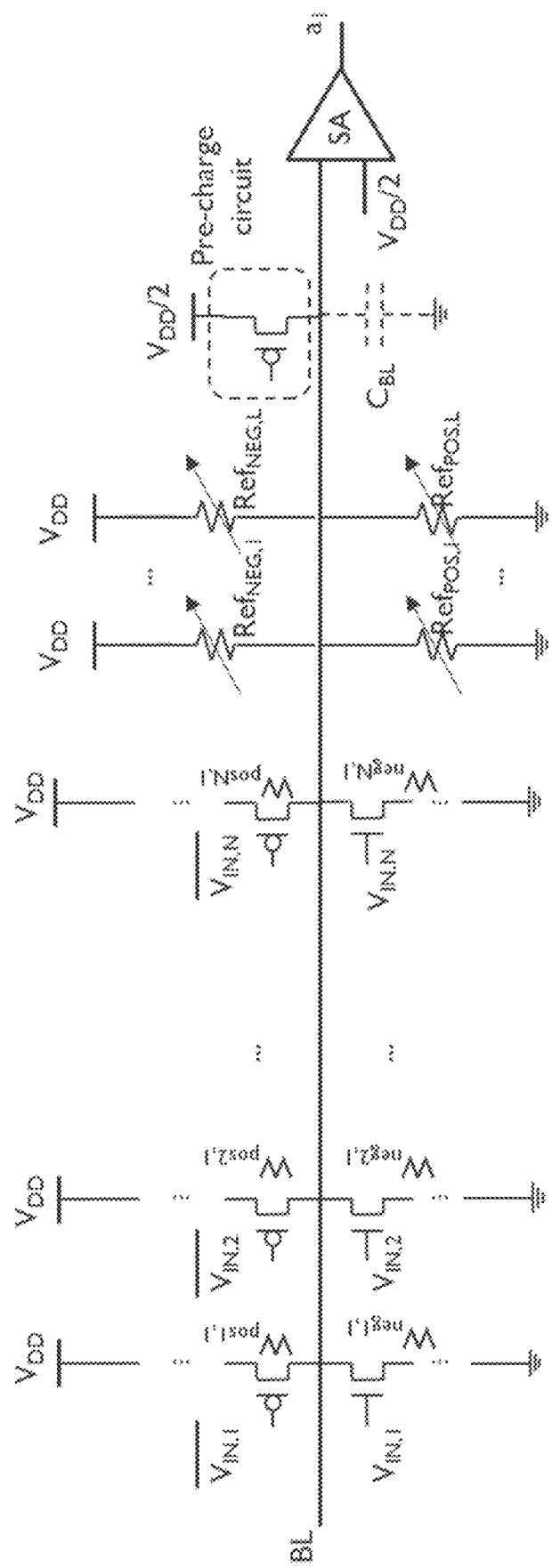

Similarly to the embodiment illustrated in FIG. 8, the reference contribution may be implemented as one or more programmable resistive memory elements rather than as transistors, in embodiments where both weight pull-up and pull-down networks and reference pull-up and pull-down networks are provided, as in the embodiments of FIG. 3 and FIG. 4. This is illustrated in FIG. 9. Also in this embodiment, the programmable resistive memory elements can be integrated in the BEOL. Similarly as in FIG. 7 and FIG. 8, also in these embodiments different planes may be provided, with vertically stacked transistors which are bypassed when a particular plane is selected, but such bypassed transistors are not illustrated in FIG. 9.

Figure 10:
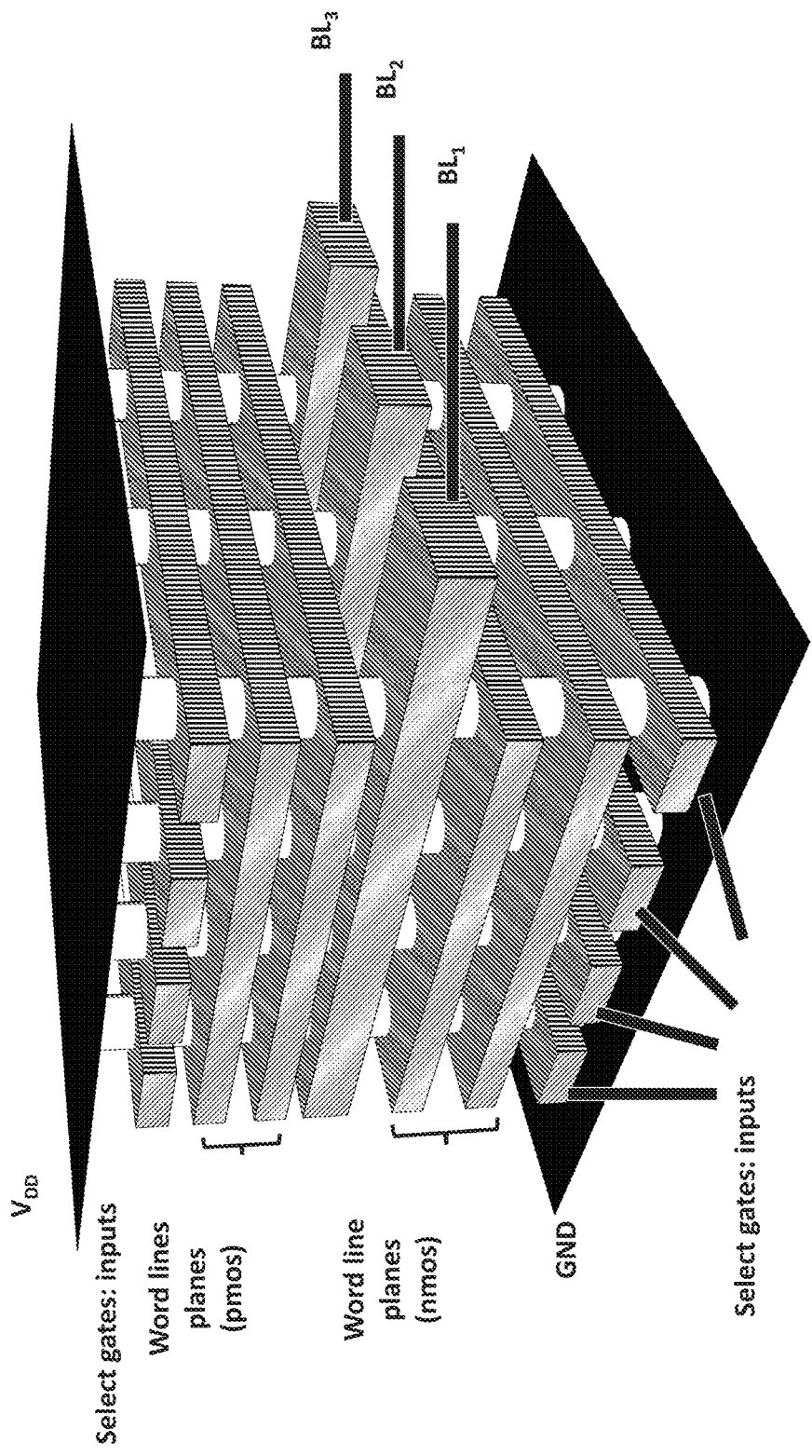
FIG. 10 shows a schematic 3D view of an architecture according to embodiments of the present disclosure, in an alternative lay-out.

As an alternative to the embodiment illustrated in FIG. 5, the embodiment illustrated in FIG. 10 may be provided. In this embodiment, the word lines on one plane are implemented as surfaces, rather than as separate strips. This is a realistic and cost effective concept, as it avoids patterning of gate lines. Only in one plane the gate lines may be patterned for strings of select gates. In this configuration, all transistors of one plane are potentially ON, but only the selected ones are connected to $V_{DD}$/GND according to the input value (binary activations). During operation, a word line plane receives an input value $V_{IN,i}$, (e.g. $V_{IN,1}$). Due to the presence of the input word line plane, this input value is applied to all transistors on that plane. However, in some examples, only one string of transistors may be activated by this input value. Accordingly, the string of select gates corresponding to the transistors to be activated, is made active, as well as all transistors on other word line planes, which are put in bypass mode. This way, only one set of transistors corresponding to the set of active select gates are electrically connected between the bitlines and $V_{DD}$, resp. GND. In this way of operation, however, calculations may not be done in parallel, because $V_{IN}$,i values have to be applied to a particular word line plane sequentially, and select gate inputs have to be switched sequentially to electrically connect other transistors between the bitline and $V_{DD}$ or GND.

Figure 11:
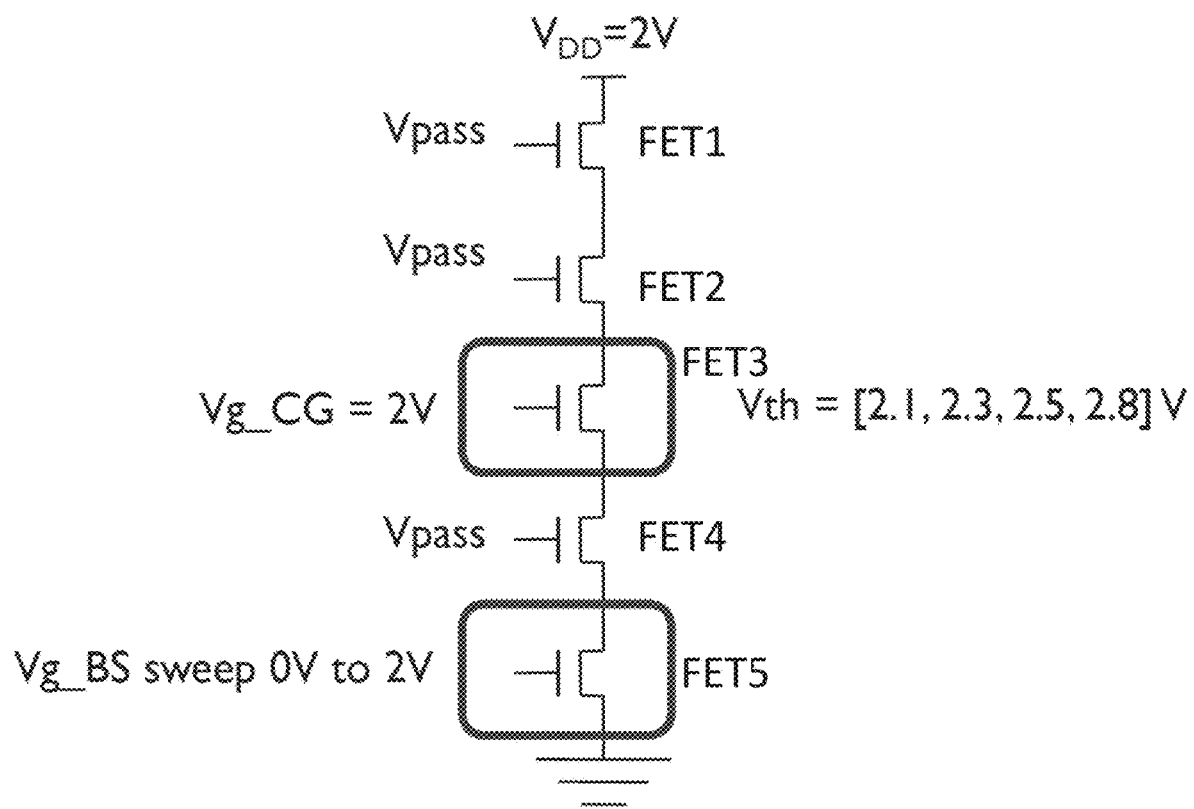
FIG. 11 illustrates a transistor string used for experimental validation of the present disclosure.

A device under test is illustrated in FIG. 11. It consists of a vertical 3D NAND string of five n-channel MOSFET transistors coupled between ground (GND) and a supply voltage ($V_{DD}$), which in the experiment equals 2V. For the ease of explanation, the MOSFETs are named, from top to bottom FET1, FET2, FET3, FET4 and FET5. FET1, FET2 and FET4 are brought in bypass mode, (i.e. they are brought in conduction), so that there is an electrical connection between what is coupled at their main electrodes (source and drain). FET5 is a select transistor. The voltage applied to its control electrode (gate) sweeps between −3V and 2V. FET3 is a transistor which can be used just as FET1, FET2 and FET4, but which may be selected for actively contributing to a new value of a node in a next layer of a neuromorphic network. A gate voltage of 2V is applied to the control electrode (gate) of FET3. Experiments are done with different threshold voltages for FET3, in the range [2.1V, 2.3V, 2.5V, 2.8V]. FET3 thus is in a subthreshold condition (applied gate voltage below the threshold voltage).

Figure 12:
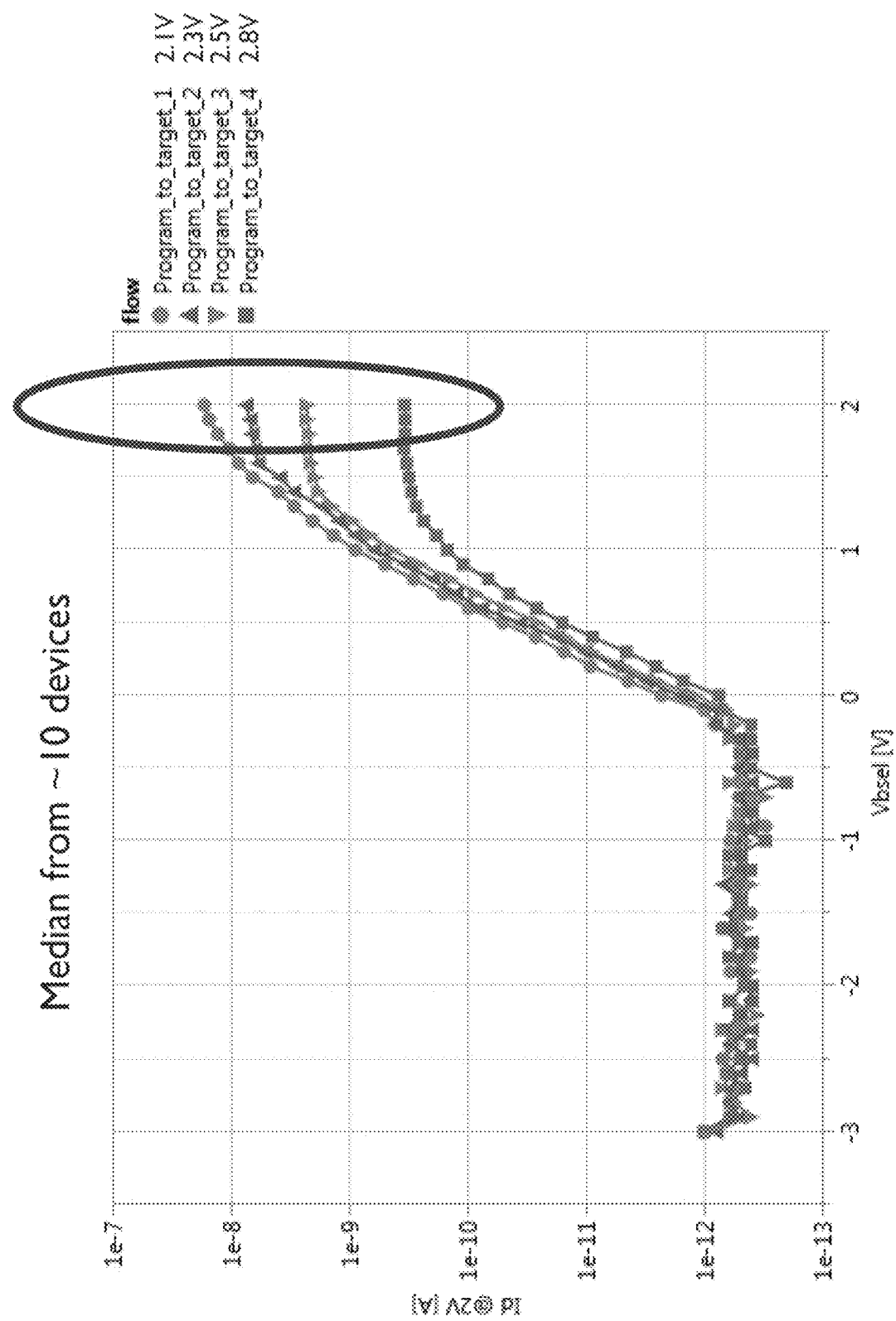
FIG. 12 shows current graphs in function of voltage, for different threshold voltages of the transistor used for doing the multiplication operation in accordance with embodiments of the present disclosure.

The measurement results are illustrated in FIG. 12. This figure shows a graph setting out the current ID through the string of transistors in function of the gate voltage of the select transistor, and this for different values of threshold voltage $V_{th}$. It can be seen from this graph that, as expected, the larger the gate voltage of the select transistor, the closer the current ID that flowing through the string approaches a saturation value. Furthermore, it can be seen that FET3 with a gate voltage just below but almost the same as the threshold voltage (in the examples illustrated FET3 with $V_{th}$=2.1V and $V_{g\_CG}$=2V), hence FET3 in the subthreshold condition, delivers the highest current.

Figure 13:
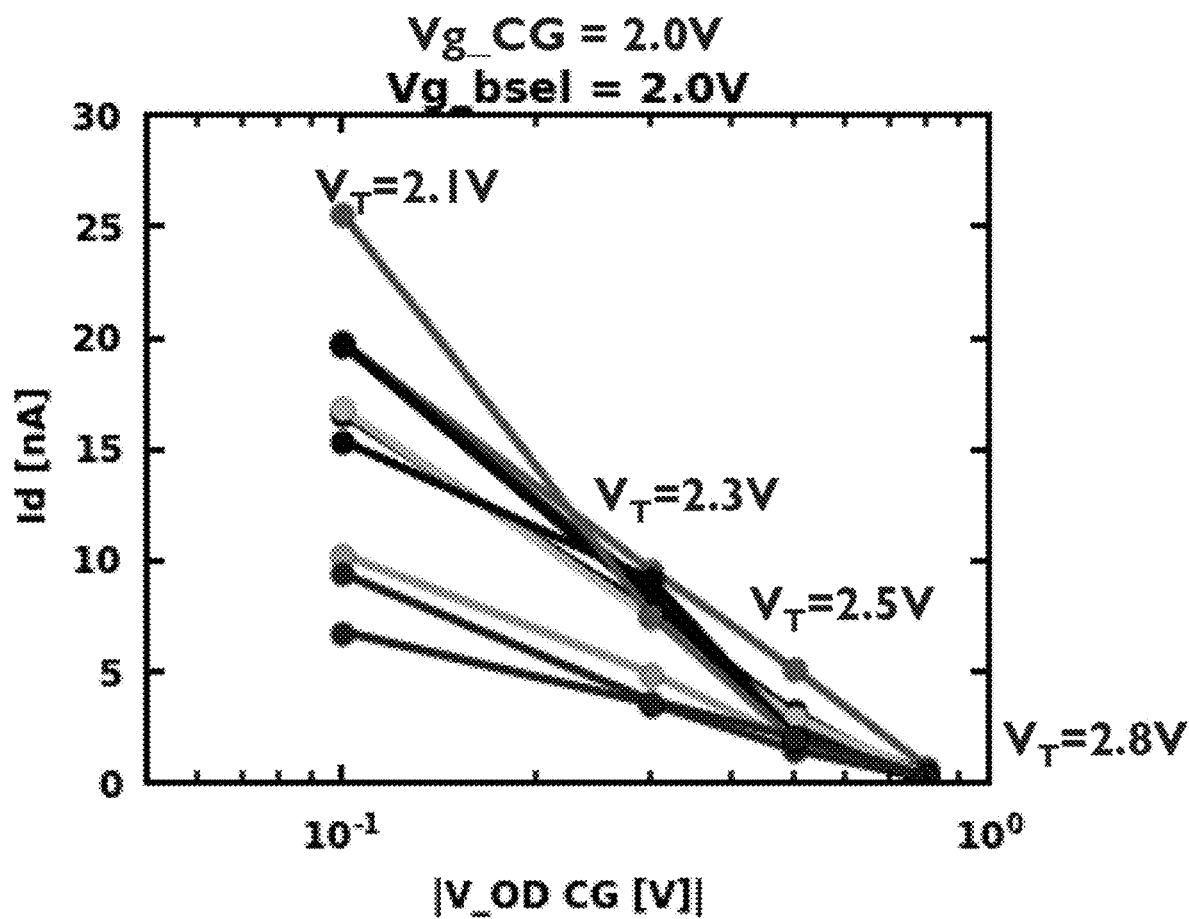
FIG. 13 shows current graphs in function of voltage, for different threshold voltages, in accordance with embodiments of the present disclosure.

FIG. 13 is a graph illustrating read-out current $I_D$ in function of overdrive voltage VOD, for different threshold voltages. The graph is repeated for a plurality of devices. This graph illustrates the weight storage in the subthreshold regime, and the consequences on read-out current $I_D$. For the graphs illustrated, the gate voltage and the select voltage both equal 2.0 V. In accordance with embodiments of the present disclosure, the weight is stored as the threshold voltage $V_{th}$ of the transistor; in the example illustrated these threshold voltages take the values of 2.1 V, 2.3 V, 2.5 V and 2.8 V, respectively. The graph illustrates the relation between the current and the programmed threshold voltage $V_{th}$, which modulates the value of the current. It can be seen from the graphs that device-to-device variability occurs. Nevertheless, the general conclusion is that a small threshold voltage $V_{th}$ corresponds to a larger current.

The programming of a weight in a transistor, (i.e. the programming of the threshold voltage $V_{th}$), can be done in transistors that have a gate stack optimized for memory operation (typically Oxide-Nitride-Oxide), so that charge carriers can be injected into the gate and trapped there. The programming is done in a manner for programming 3D NAND memories, by applying a voltage to the gate of the transistor, so that charge is trapped in the gate dielectric. The programming voltage is larger than the input and bypass voltage values. Typically, such a large voltage can be obtained with circuits called charge pumps.

The threshold voltage programming occurs on chip, after manufacturing thereof (during use). Typically, a program-verify algorithm may be implemented to program the threshold voltage of a transistor to a target threshold voltage:

Applying a minimum programming voltage to the gate of the transistor

Reading the drain current and computing the threshold voltage

Comparing the computed threshold voltage to the target threshold voltage

If the result of the comparison indicates that the computed threshold voltage equals the target threshold voltage (within an acceptable error margin), the algorithm is stopped; if not, the programming voltage is increased by a fixed delta and the steps of the algorithm are repeated. While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, embodiments of the present disclosure may be practiced in many ways. The disclosure is not limited to the disclosed embodiments.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A neural network circuit for providing a threshold weighted sum of input signals, the neural network circuit comprising:
at least two arrays of transistors with programmable threshold voltage, each transistor of the at least two arrays storing a synaptic weight as the programmable threshold voltage and having a control electrode for receiving an activation input signal, each transistor of the at least two arrays providing an output current for either a positive weighted current component in an array of a set of first arrays or a negative weighted current component in an array of a set of second arrays;

an associated reference network for each array of transistors configured to provide a reference signal to be combined with the positive weight current component or the negative weight current component of the transistors of the associated array, the reference signal having opposite sign compared to the positive weight current component or negative weight current component of the associated array; and at least one bitline for receiving the combined positive current component or negative current component, each combined with their associated reference signals.

2. The neural network circuit according to claim 1, wherein the transistors of the at least two arrays connect to a single bitline for receiving the positive current weighted component and the negative weighted current component combined with reference signals.

3. The neural network circuit according to claim 1, wherein a comparator compares the combined positive current component and negative current component combined with reference signals to a pre-determined reference value.

4. The neural network circuit according to claim 1, wherein first transistors of one of a first array connect to a first bitline, different from a second bitline, to which second transistors of a second arrays connect, the first bitline and second bitline, respectively, configured to receive a combined positive current component and associated reference signal, or the combined negative weighted current component and associated reference signal.

5. The neural network circuit according to claim 4, further comprising a differential amplifier configured to amplify a difference between the combined positive weighted current component and negative reference signal with the combined negative weighted current component and positive reference signal.

6. The neural network circuit according to claim 1, wherein the transistors of one of the arrays are laid out in a single physical plane of an electronic component.

7. The neural network circuit according to claim 6, wherein a plurality of planes of transistors are stacked vertically.

8. The neural network circuit according to claim 1, wherein the positive weighted current component and negative weighted current component are provided by driving multiple transistors in parallel.

9. The neural network circuit according to claim 1, wherein the transistors generating the positive weighted current component or negative weighted current component are laid out on a horizontal plane of a three-dimensional array.

10. The neural network circuit according to claim 1, wherein the transistors are operated in subthreshold region and act as current sources controlled by an input gate voltage.

11. The neural network circuit according to claim 1, wherein the reference network is implemented as one or more transistors in parallel.

12. The neural network circuit according to any of claim 1, wherein the reference network is implemented as one or more programmable resistive memories in parallel.

* * * * *